(12) United States Patent
Urman et al.

(10) Patent No.: US 7,208,694 B2
(45) Date of Patent: Apr. 24, 2007

(54) CAPACITANCE ACTIVATED SWITCH DEVICE

(75) Inventors: Robert Urman, Schaumburg, IL (US); James W. Citta, Lombard, IL (US)

(73) Assignee: Wabtec Holding Corp., Wilmerding, PA (US)

( * ) Notice: Subject to any disclaimer, the term of this patent is extended or adjusted under 35 U.S.C. 154(b) by 177 days.

(21) Appl. No.: 11/084,789

(22) Filed: Mar. 18, 2005

(65) Prior Publication Data

US 2005/0231147 A1 Oct. 20, 2005

Related U.S. Application Data

(60) Provisional application No. 60/563,167, filed on Apr. 16, 2004.

(51) Int. Cl.
*H03K 17/975* (2006.01)

(52) U.S. Cl. ............... 200/600; 200/510; 250/221; 345/173

(58) Field of Classification Search .......... 200/86 R, 200/85 A, 520, 510–513, 600; 250/221, 250/222.1, 341.1; 345/166, 173, 156–158
See application file for complete search history.

(56) References Cited

U.S. PATENT DOCUMENTS

| | | | |
|---|---|---|---|
| 4,022,996 A | 5/1977 | Lucas et al. | |
| 4,371,762 A | 2/1983 | Diamond | |
| 4,431,882 A * | 2/1984 | Frame | 200/5 A |
| 4,562,315 A * | 12/1985 | Aufderheide | 200/5 A |
| 5,118,910 A | 6/1992 | Duhon et al. | |
| 5,134,259 A * | 7/1992 | Page, Jr. | 200/341 |
| 5,583,386 A * | 12/1996 | Meixner et al. | 307/326 |
| 5,942,815 A * | 8/1999 | Neuman et al. | 307/139 |
| 6,064,165 A | 5/2000 | Boisvert et al. | |
| 6,344,642 B1 | 2/2002 | Agam et al. | |
| 6,661,410 B2 * | 12/2003 | Casebolt et al. | 345/173 |

FOREIGN PATENT DOCUMENTS

| | | |
|---|---|---|
| EP | 1 235 190 A | 8/2002 |
| WO | WO 96/36134 A | 11/1996 |
| WO | WO 00/15931 A | 3/2000 |

OTHER PUBLICATIONS

Motorola, Analog Product, MC33794 Fact Sheet, 33794 Electric Field Imaging Device, (2 pp.), © 2002 Motorola, Inc., MC33794FS/D Rev. 1.

* cited by examiner

*Primary Examiner*—Richard K. Lee
(74) *Attorney, Agent, or Firm*—The Webb Law Firm

(57) ABSTRACT

A capacitance based switch device employs an electric field imaging device electrically coupled via an electrical conductor to a conductive electrode member that is attached to the door or any other suitable surface. Such electric field imaging device generates a sine wave which is transmitted to the conductive electrode member and produces a surrounding electrical field. Any human body part which enters such electrical field will create a capacitance load due to the body being grounded to a surface. Reduction in distance between the body part and the conductive electrode will increase the capacitance and will decrease the voltage intermediate the resistor and conductive electrode which is an inverse function of the capacitance. Such change in voltage will be detected by a microcontroller by comparing voltages at each end of the resistor and the change exceeding a predetermined threshold will be associated with an output control signal.

53 Claims, 4 Drawing Sheets

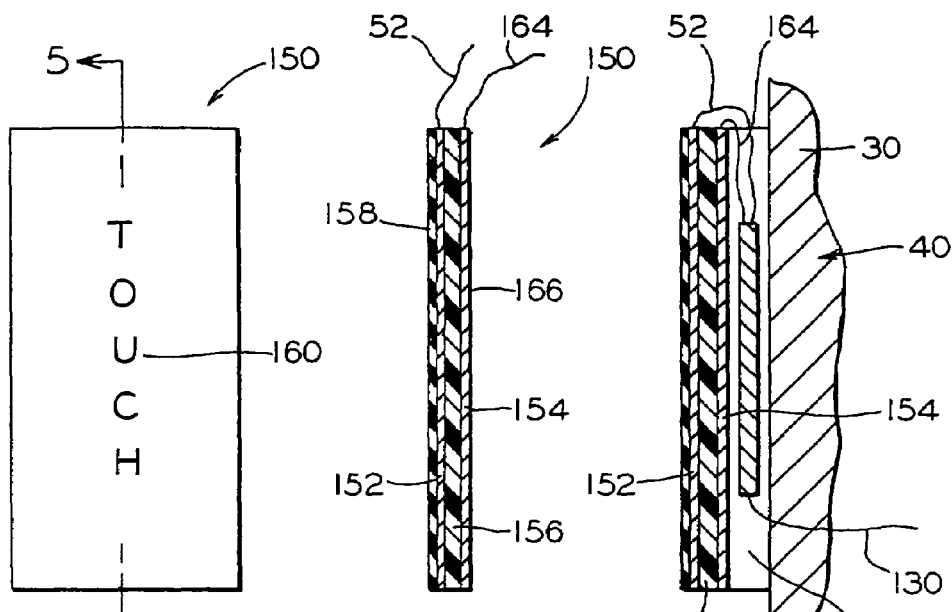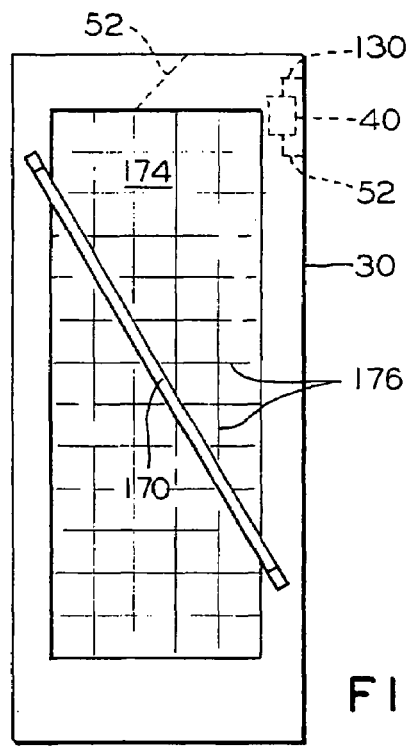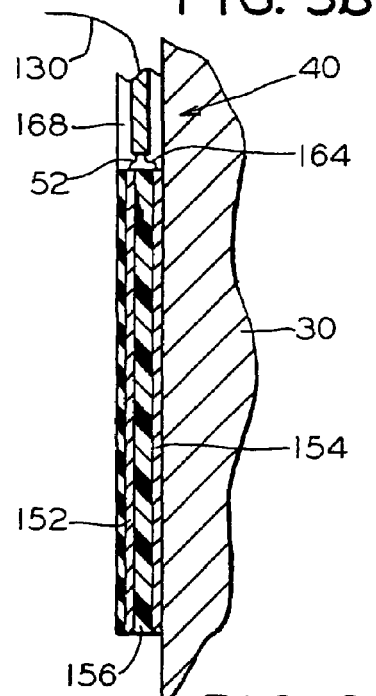

CAPACITANCE ACTIVATED SWITCH DEVICE

CROSS-REFERENCE TO RELATED APPLICATIONS

This application is related to and claims priority from U.S. Provisional Patent Application Ser. No. 60/563,167 filed on Apr. 16, 2004.

FIELD OF THE INVENTION

The present invention relates, in general, to a switch device and, more particularly, the instant invention relates to a switch device operable by a capacitive load and, still more particularly, the instant invention relates to a capacitance activated switch device for use in a transit vehicle.

BACKGROUND OF THE INVENTION

The following background information is provided to assist the reader to understand the environment in which the invention will typically be used. The terms used herein are not intended to be limited to any particular narrow interpretation unless specifically stated otherwise in this document.

It is well known that a vast majority of urban transit vehicles utilize a plurality of side mounted powered door systems for passenger ingress and egress. In some applications such as underground subways, where the transit vehicles operate in a multiple vehicle configuration and further operate in a climatically controlled environment and where the passenger generally pays first to gain access to the transit vehicle, all side door systems in every transit vehicle are being operated at every station.

In other applications, especially where transit vehicles operate above ground, the passenger may pay only upon entering the vehicle through only one side door located next to a vehicle operator while the other side doors are used predominantly for passenger egress. In such applications, it is desirable to maintain a consistent interior climatic environment of the transit vehicles for passenger comfort and minimize the effect of external environmental factors. Additionally, partially operating side door systems decreases component wear and increases durability and reliability of such side door systems. Therefore, in such applications, it is common for a vehicle operator to selectively open certain side doors while placing other side doors in a condition enabling the passenger to open such side doors by contacting a switch device mounted either directly on the side door or in its vicinity.

The well known switch devices used in such applications are touch bars and touch tape switches. U.S. Pat. No. 4,022,996 entitled "Switching Mechanism for Bus Doors with Manually Operated Touch Bar" teaches a touch bar comprising a tubular member terminated by upper and lower housings at each end that enables a small range of lateral movement in any direction. Either one or both end housings contain a switch of the electromechanical nature that is activated upon movement of the tubular member caused by the passenger contact. The resulting electrical signal is used by the door drive and door controller to open the door which then enables passenger egress.

U.S. Pat. No. 5,118,910 entitled "Illuminated, pressure-actuated switch" teaches a press-at-any-point tape switch suitable for opening doors of a transit vehicle. The switch includes a pair of electrodes which are spaced in a steady state nonactivated condition and produce an electrical signal upon pressure being applied to an exterior surface of the tape switch. The resulting electrical signal is used by the door drive and door controller to open the door which then enables passenger egress.

One disadvantage of such devices is that they contain moving components, which decrease performance reliability over time and are associated with increased manufacturing costs. Another disadvantage of such devices is that they require a pressure to be applied thereto in order to achieve activation, thus making their use more difficult for a disabled person or child.

As it can be seen from the above discussion, there is a need for an improved switch device that eliminates the use of moving components and is better suitable for use by a disabled passenger or child.

It is well known that a door system of the transit vehicle must incorporate an obstruction detection capability during the closing cycle in order to detect a passenger or an object present in the path of the closing door. Generally, the obstruction detection is accomplished by four different methods.

In a first aspect, as taught by U.S. Pat. No. 4,371,762 entitled "Contactless Pressure Sensitive Switch", a sensitive rubber edge is employed at the leading edge of the door in combination with a pressure wave switch having an electrical connection with the door controller. The sensitivity of the rubber edge is achieved by incorporating a sealed chamber with a connection of a predetermined orifice to the pressure wave switch. The passenger or object contacting the rubber edge during the door closing cycle will deform the rubber edge thus causing the pressure differential within the seal chamber to change the state of the pressure wave switch and prevent further door closing via the door controller either terminating the closing motion or reversing the motion of the door in the opening direction.

A variation of such obstruction detection method is associated with use of an electrical tape type switch inserted into a chamber and having an electrical connection with the door controller, whereby the oppositely disposed contacts of the switch engage one another upon deformation of the rubber edge.

In a second aspect, as best taught by U.S. Pat. No. 6,064,165 entitled "Power Window or Panel Controller", a microprocessor based door controller executes a software algorithm during door closing motion and monitors and compares parameters such as electrical current, position versus time, and others, against a predetermined threshold. The passenger or object contacting the door during the closing cycle will cause such parameters to differ from the threshold, for example the electrical current will increase, enabling the door controller to prevent further door closing.

In a third aspect, the obstruction detection may be enabled by the door controller if the door did not reach a final closing position within a predetermined time period.

In a forth aspect, as taught by U.S. Pat. No. 6,344,642 entitled "Door Control Apparatus", the obstruction detection method employs a sensor centrally installed above the door opening and having an electrical connection with the door controller. Presence of the passenger or object will be detected by the sensor enabling the door controller to prevent further door closing.

The main disadvantage of the first three methods is that obstruction detection is enabled only upon physical contact with the passenger or object which is not desirable when such passenger is a small child or an adult with limited physical capabilities as the contact with the moving door may result in some form of injury.

Utilization of remote sensors in the fourth method eliminates physical contact but is generally costly to implement and is subject to precise tuning in order to properly define coverage area and minimize external noise.

Therefore, it is desired to implement obstruction detection that substantially minimizes or eliminates physical contact between the passenger or object and closing door and reduces installation costs.

SUMMARY OF THE INVENTION

In one aspect, the present invention overcomes the disadvantages of the presently used switch devices for opening doors by employing an electric field imaging device electrically coupled via an electrical antenna conductor to a conductive electrode member that is attached to the door or any other suitable surfaces with the use of electrical isolating spacers. Such electric field imaging device generates a sine wave of a predetermined frequency, which is transmitted to the electrode member thus producing a surrounding electrical field. A resistor of a predetermined value is electrically coupled intermediate the wave generator and the conductive electrode member. Any body part, such as hand, arm, shoulder, or torso, which enters such electrical field, will create a capacitive load due to the body being grounded to a floor surface. Reduction in distance between the body part and the conductive electrode will increase the capacitance and will decrease the voltage intermediate the resistor and conductive electrode which is an inverse function of the capacitance. Such change in voltage will be detected by a combination of the electric field imaging device and a microcontroller coupled thereto by comparing voltages at each end of the resistor and the change exceeding a predetermined threshold will be associated with an output signal. Such output signal, when received by a door controller, will be interpreted thereby as a request to open the door enabling a door drive connected to the door to move it in an opening direction. Because the change in voltage will be detected prior to physical contact between the passenger and the conductive electrode member, the opening of the door will not require the passenger to apply pressure. The electric field imaging device and the microcontroller may be mounted to a printed circuit board that can be disposed within a housing of the touch bar, in the space occupied by the electromechanical switch or may be adapted with its own housing and disposed adjacent the conductive electrode member in a touch tape switch configuration. In alternative configurations, the door itself manufactured form conductive material may be used as a switch device or the electrical antenna conductor may be imbedded in a glass portion of the door thus enabling the passenger to open the door by approaching such glass portion.

In another aspect, the present invention overcomes the disadvantages of the presently used switch devices for obstruction detection by employing the electrical antenna conductor disposed within the door edge, in a through aperture generally extruded therein. The passenger or an object present in the path of the closing door will create the capacitive load when entering the electrical field formed by the electrical antenna conductor thus enabling the door controller to either discontinue or reverse closing motion of the door. Alternatively, the door itself manufactured from conductive material and coupled to the electrical antenna conductor may be employed for obstruction detection.

OBJECTS OF THE INVENTION

It is, therefore, one of the primary objects of the present invention to provide a capacitance activated switch device.

Another object of the present invention is to provide a capacitance activated switch device that does not include movable components.

Yet another object of the present invention to is provide a capacitance activated switch device that can be employed in opening a door of a transit vehicle.

A further object of the present invention is to provide a capacitance activated switch device employed in detecting obstructution during door closing motion.

Still another object of the present invention is to provide a capacitance activated switch device that reduces manufacturing costs.

It is an additional object of the present invention to provide a capacitance activated switch device that does not require applied pressure to operate.

Yet another object of the present invention is to provide a capacitance activated switch device that can be easily retrofitted in the field.

In addition to the various objects and advantages of the present invention which have been generally described above, there will be various other objects and advantages of the invention that will become more readily apparent to those persons who are skilled in the relevant art from the following more detailed description of the invention, particularly, when the detailed description is taken in conjunction with the attached drawing figures and with the appended claims.

BRIEF DESCRIPTION OF THE DRAWINGS

FIG. 4 is a front elevation view of the touch switch of the present invention;

FIGS. 5a–5c are cross-sectional views of the touch switch along lines 5—5 in FIG. 4 particularly showing an alternative disposition of the capacitance activated switch device of the present invention;

FIG. 6 is a front elevation view of the capacitance activated switch device of the present invention in combination with the door handle;

Figure 1:
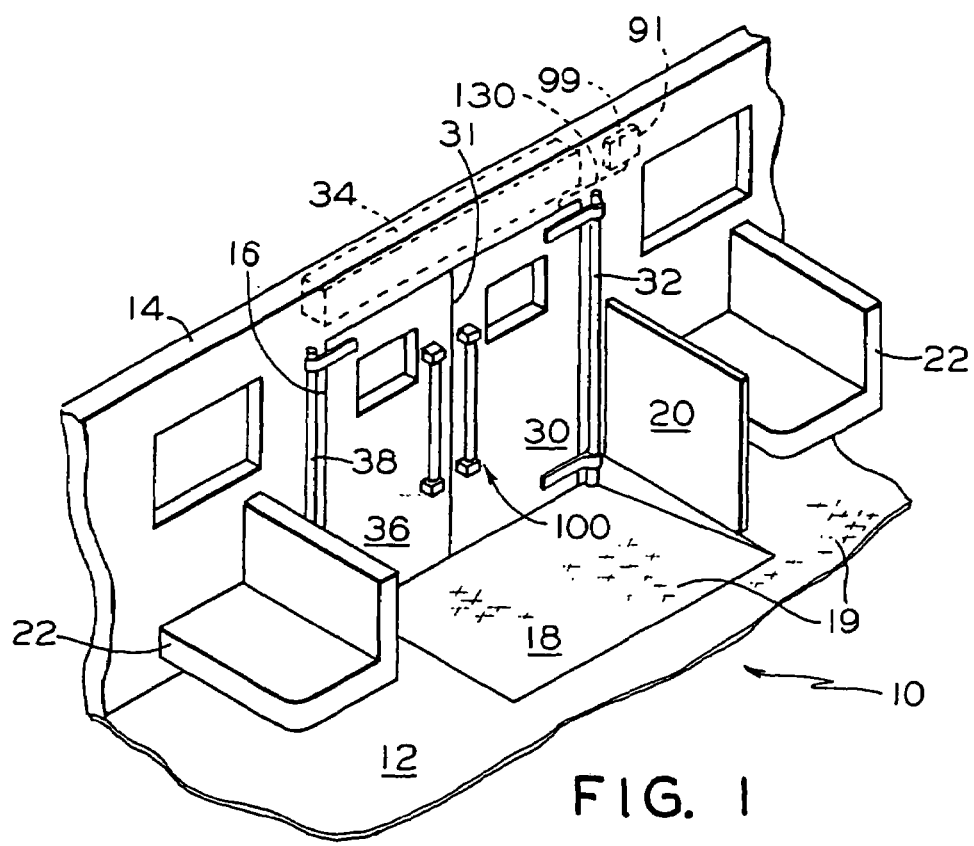
FIG. 1 is a partial perspective view of a transit vehicle.

DESCRIPTION OF THE PRESENTLY PREFERRED AND VARIOUS ALTERNATIVE EMBODIMENTS OF THE INVENTION

Before describing the invention in detail, the reader is advised that, for the sake of clarity and understanding, identical components having identical functions have been marked where possible with the same reference numerals in each of the Figures provided in this document.

The structure and operation of the present invention will be explained in combination with a door for a transit vehicle as use thereof in other applications will be obvious to those skilled in the relevant art.

As best illustrated in FIG. 2A, there is a capacitance activated switch device, generally designated 40. Such capacitance activated switch device 40 comprises a capacitance means, generally designated 41, having a generator 42 capable of generating a sine wave 44 of a predetermined frequency 46. The capacitance means 41 is grounded at a first ground means 48 and is adapted to at least receive an operating voltage 97 associated with an input voltage $V_{INPUT}$. A first resistor 50 of a first predetermined resistive value is internally coupled to the generator 42 at a first end 72 and is externally coupled to at least one electrical antenna output 49 at a second end 73. In operation, such first resistor 50 will enable a first voltage $V_1$ at a first end 72 and a second voltage $V_2$ at a second end 73. In a steady state condition, with no electrical load being applied to the at least one electrical antenna output 49, such first voltage $V_1$ is equal to the second voltage $V_2$. The capacitance means 41 is adapted for providing at least one first digital signal 74, preferably being a plurality of first digital signals 74, and at least one analog output signal 76 to microcontroller 78 capable of executing a predetermined software algorithm. The capacitance means 41 is further adapted for receiving at least one second digital signal 75, preferably being a plurality of second digital signals 75, from the microcontroller 78. Preferably, such capacitance means 41 is an electric field imaging device model MC 33794 manufactured by MOTOROLA and/or its spin-off, Freescale Semiconductor, Inc.

The at least one electrical antenna conductor 52 is electrically coupled to the at least one electrical antenna output 49 at one end and to a conductive electrode means 54 at a distal end. The conductive electrode means 54 is rigidly attached to a mounting member 56. At least one electrical isolator means 58 may be provided in applications where such member 56 does not inherently contain dielectric capabilities.

Figure 2:
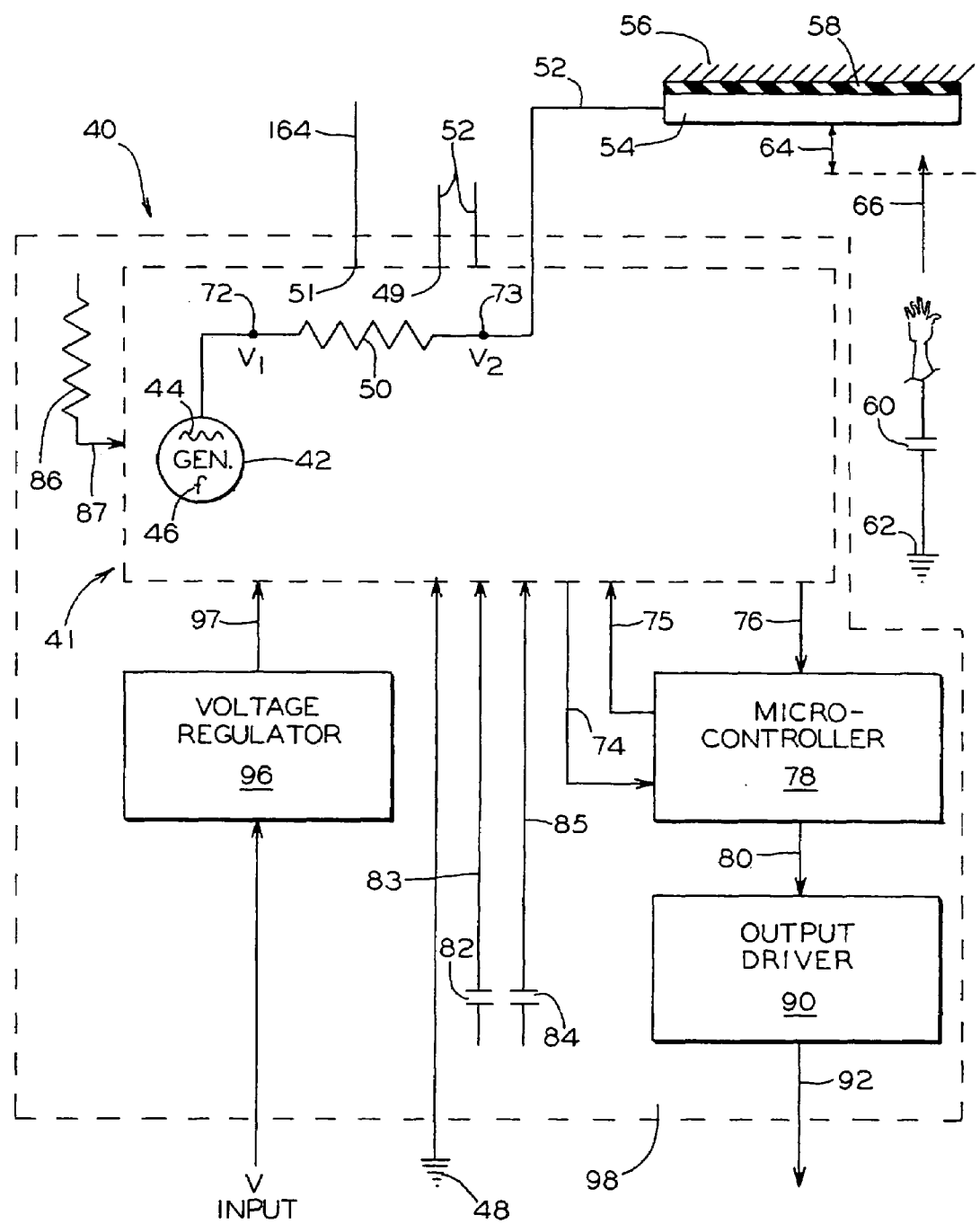
FIG. 2 is a schematic diagram of a capacitance activated switch device of the present invention.

As schematically illustrated in FIG. 2, a means 60 representing an object or human body part is coupled to the third ground means 62, generally being the floor portion 18.

In operation, upon supply of the input voltage $V_{INPUT}$, the generator 42 will generate the sine wave 44 which will be transmitted to the conductive electrode means 54 by the at least one electrical antenna conductor 52 enabling generation of an electrical field 64 having a predetermined depth and at least partially surrounding the conductive electrode means 54. Any grounded object or human body part 60 grounded to the third grounding means 62 and entering the electrical field 64 will produce a capacitive load 66. Such capacitive load 66 will result in second voltage $V_2$ being smaller than the first voltage $V_1$. Continuing movement of the object 60 toward the conductive electrode means 54 will incrementally increase such capacitive load 66 and therefore incrementally decrease the second voltage $V_2$. The maximum capacitance value will be achieved upon contact of such object 60 with the conductive electrode means 54.

The change in the second voltage $V_2$ will be detected by the microcontroller 78 via at least one analog input 76 and the change exceeding a predetermined voltage threshold in the software algorithm will trigger an output signal 80 generating at least one control signal 92 to the door controller which is not shown but is well known in the art. Preferably, an output driver 90 is disposed intermediate the output signal 80 and the at least one control signal 92 to receive such output signal 80 and generate the at least one control signal 92 being a voltage signal and further being equal to the input voltage $V_{INPUT}$.

The software algorithm is capable of differentiating between a gradual movement of the means 60 within the electrical field 64 as such gradual movement will result in a gradual change of the second voltage $V_2$ over a first predetermined period of time and an impact between the means 60 and the conductive electrode means 54 which will result in a change of the second voltage $V_2$ over a second predetermined period of time being substantially smaller than such first predetermined period of time.

The capacitance activated switch device 40 may be adapted with a second resistor 86 having a second predetermined resistive value which is electrically coupled to the capacitance means 41 via an electrical path 87 for adjusting the predetermined frequency 46 and, more importantly, for adjusting a predetermined depth of the electrical field 64.

The capacitance activated switch device 40 may further include a first capacitor 82 having a first predetermined capacitance value generally defining a lower capacitance limit and second capacitor 84 having a second predetermined capacitance value generally defining an upper capacitance limit. It will be appreciated that such first capacitor 82 will generate a first voltage reference 83 defining a predetermined upper limit of the expected voltage from the electrical field 64 and such second capacitor 84 will generate a second voltage reference 85 defining a predetermined lower limit of the expected voltage from the electrical field 64. In a first aspect, such first and second voltage references 83 and 85 respectively may be used by the microcontroller 78 to measure actual capacitance value of the capacitive load 66. In a second aspect, the first voltage reference 83 may be used by the microcontroller 78 to identify a broken electrical connection coupled to the capacitance means 41. In a third aspect, the microcontroller 78 can compensate for environmental temperature or input voltage $V_{INPUT}$ variations by continuously measuring the first and second voltage references 83 and 85, respectively, by continuously comparing actual measurements against their predetermined default values and storing the last calculated difference. In operation, such last calculated difference will be used by the microcontroller 78 to proportionally adjust the measured second voltage $V_2$ via the software algorithm.

In applications wherein the input voltage $V_{INPUT}$ differs from an operating voltage 97, which is 12 VDC for MOTOROLA/Freescale Semiconductor, Inc device model MC 33794, the capacitance activated switch device 40 may additionally include a means 96, such as a well known voltage regulator 96, for converting input voltage $V_{INPUT}$ into the operating voltage 97.

It will be appreciated that means 96 may also be an internal power source such as a battery for supplying such operating voltage 97.

Preferably, the capacitance means 41, the microcontroller 78, the output driver 90, the first and second capacitors 82 and 84 respectively, the second resistor 86, and the means 96 are mounted to a printed circuit board 98 by one of a through hole and surface mount methods. In an alternative embodiment, such components may be disposed within the door controller (not shown).

The reader's attention is now directed to FIG. 1 illustrating a portion of a transit vehicle, generally designated 10, having a floor member 12 and a wall member 14. A door 30 is disposed within a wall aperture 16 and is driven by a door drive 34 in one of closing and opening directions to at least partially cover and uncover such aperture 16. The door 30 is supported by a door support means 32 which may be integral to door drive 34. A floor portion 18 disposed adjacent the door 30 may be constructed as a planar inclined surface or constructed as a stairwell which is not shown but is well known in the art. Typically, a traction member 19 manufactured from elastomeric or polymer material is applied to a surface of such floor member 12 and floor portion 18. The traction member 19 may be a well known sensitive treadle mat.

Alternatively, such floor portion 18 may incorporate a movable accessibility device (not shown), such as taught by U.S. Pat. No. 5,775,232, which extends outwardly from the wall member 14 to accommodate ingress and egress of passengers with disabilities or needing further assistance. The teaching of U.S. Pat. No. 5,775,232 is hereby incorporated by reference thereto.

A screen member 20 may be provided within the transit vehicle 10 for separating a seating area 22 from the standing area defined by the door 30 and floor portion 18. A second door 36 supported by a door support means 38 may be disposed within the wall aperture 16 adjacent the first door 30. In such arrangement, the first door 30 and the second door 36 move in opposite directions for covering and uncovering the wall aperture 16.

Figure 3:
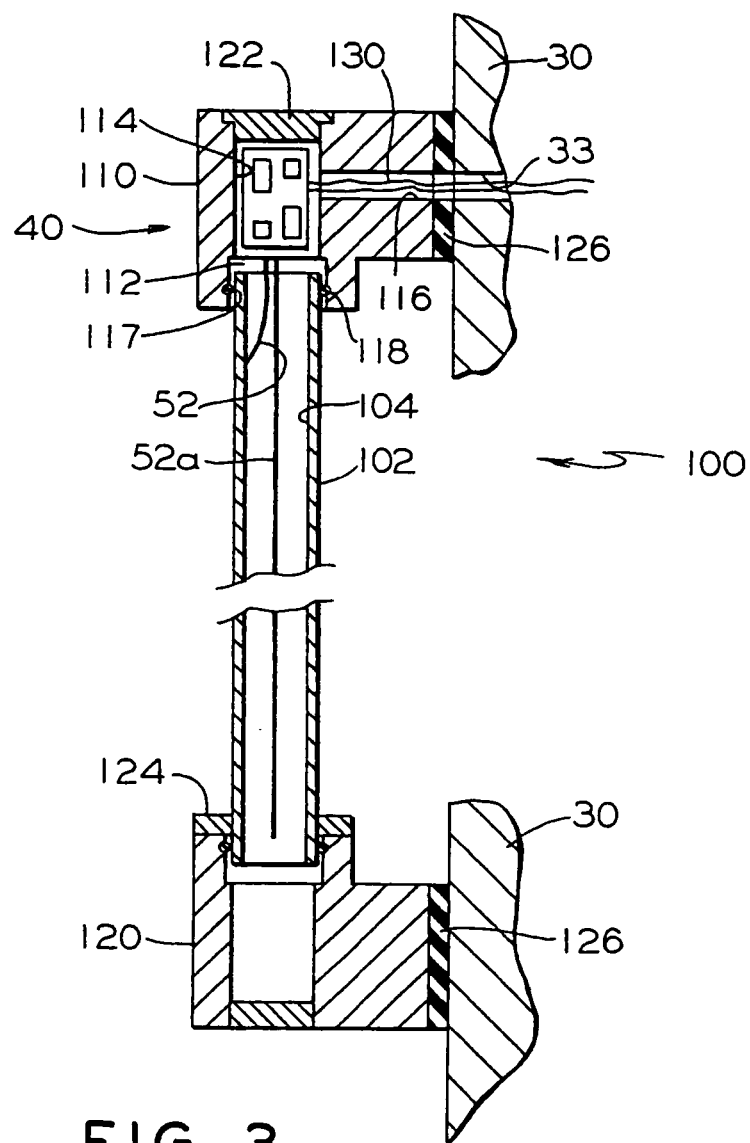
FIG. 3 is a cross-sectional elevation view of a touch bar for the transit vehicle in combination with the capacitance activated switch device of the present invention.

The structure and operation of the capacitance activated switch device 40 of the first embodiment is illustrated in combination with an activating member such as a touch bar, generally designated 100, rigidly attached to at least door 30 adjacent its leading edge 31. As best illustrated in FIG. 3, such touch bar 100 comprises a tubular member 102 having a wall 104 and being disposed between an upper housing 110 and a lower housing 120 which are rigidly attached to the surface of the door 30.

The upper housing 110 is adapted with a first cavity 112 for attachment to an end of the tubular member 102, a first aperture 114 and a second aperture 116 which is aligned with an aperture 33 disposed within the door 30. The first cavity 112 may be provided with an annular grove 117 for housing a resilient member 118 surrounding the tubular member 102. The first aperture 114 is fitted with an end plug 122.

The lower housing 120 is constructed generally similar to the upper housing except that it does not contain an aperture 116 and is further provided with the cover member 124.

Typically, the upper and lower housings 110 and 120, respectively, are manufactured from electrically non-conductive materials enabling direct attachment to the door 30. It will be appreciated that a metallic electrically conductive substitution may be readily made with an employment of at least one electrical isolator 126 disposed intermediate such housings and the door 30.

In the presently preferred embodiment, capacitance activated switch device 40 is secured within the first aperture 114, preferably by the end plug 122. The at least one electrical antenna conductor 52 is electrically and rigidly attached to either interior or exterior surfaces of the wall 104 by any well known method including but not limited to such methods as soldering, brazing or mechanical fastening.

In applications where such tubular member 102 is manufactured from a nonconductive material the at least one electrical antenna conductor 52 may include a rigid antenna portion 52a longitudinally disposed within the tubular member 102.

The supply voltage VINPUT and the at least one control signal 92 are provided via a wire bundle 130 routed through the second aperture 116 and the door aperture 33 to the door controller (not shown).

In operation, presence of the supply voltage $V_{INPUT}$ will generate an electrical field 64 at least partially surrounding the tubular member 102. The passenger approaching the tubular member 102 with any body part, such as hand, arm, shoulder, or torso will create a capacitive load 66 upon entering such at least partially surrounding electric field 64 causing the value of the second voltage $V_2$ to change. Such change in the second voltage $V_2$ will be detected by the capacitance means 41 and the microcontroller 78 and followed by generation of the output signal 80 and subsequently followed by generation of at least one control signal 92 which will be interpreted by the door controller (not shown) as a request to open or reopen the door 30 enabling the door drive 34 to move the door 30 in an opening direction. The at least one control signal 92 may be further used to energize visual indicators (not shown) disposed above the door 30 or enable other annunciation or control functions.

It will be appreciated that since a capacitor is defined as a pair of electrical conductors separated by a space, any coating or non conductive material encasing such tubular member 102 will not disrupt operation of the capacitance activated switch device 40.

It also has been discovered during testing that a passenger wearing a winter glove or a heavy winter coat will generate a capacitance load upon entering the electric field 64, thus enabling opening of the door 30.

In an alternative embodiment, the capacitance activated switch device 40 may be mounted remotely, as best illustrated by reference 99 in FIG. 1. It will be appreciated that in such installation, the capacitance activated switch device 40 will be disposed within a housing 91 and the wire bundle 130 will be routed through the vehicle structure, the door 30 and the upper housing 110 and such wire bundle 130 will further contain the at least one electrical conductor 52. Preferably, such at least one electrical antenna conductor 52 will be shielded and have a shield conductor 164 coupled to a shield output 51 of the capacitance activated switch device 40.

The structure of the capacitance activated switch device 40 of another embodiment is illustrated in combination with a touch type switch, generally designated 150, which may be rigidly attached to the door 30 at inner and outer surfaces thereof, wind screen 20 or in other predetermined locations disposed within the transit vehicle 10.

As best illustrated in FIGS. 4 and 5a–5c, such touch switch 150 has a predetermined configuration and comprises a front conductive member 152 and an opposed rear conductive member 154 separated with an insulator member 156. The at least one electrical antenna conductor 52 is electrically coupled to the front conductive member 152 and the shield conductor 164 is electrically coupled to the rear conductive member 154. An outer protective member 158 manufactured from a non-conductive material, preferably a polymer or an elastomer, may be employed to protect the touch switch 150 from environmental factors, such as moisture, dust and dirt. Indicia 160 may be disposed within the outer protective member 158 or disposed on the front conductive member 152 for providing a predetermined instruction to passengers. As has been aforementioned, at least one electrical isolator 126 may be disposed intermediate the rear conductive member 154 and the mounting structure, such as door 30 or wind screen 20, in applications wherein such door 30 or wind screen 20 are manufactured from any conductive materials.

The touch switch 150 may be attached with the use of an adhesive 166 applied to the back surface of the rear conductive member 154 or the electrical isolator 126 or with the use of well known mechanical fasteners.

Preferably, for manufacturing cost efficiency, the touch switch 150 is manufactured from a well known dual side printed circuit board material, wherein the front conductive member 152 and the rear conductive member 154 are copper foil of a predetermined weight and the insulator member 156 is an epoxy-glass FR-4 (G-10) board of a predetermined thickness.

In an alternative embodiment, the touch switch 150 is adapted with a housing member 168 disposed intermediate the rear conductive member 154 and the mounting structure, such as the door 30, as best illustrated in FIG. 5b or disposed planar with the touch switch 150 as best illustrated in FIG. 5c. Such housing 168 is for locally containing the capacitance activated switch device 40.

Those skilled in the art will readily understand that the embodiment of FIG. 5b will be most suitable for touch switches 150 having a round, rectangular or square shape while the embodiment of FIG. 5c will be most suitable for touch switches 150 being used to replace a well known tape switch which is generally characterized by its length being significantly larger than its width.

It will be further understood that such touch switches 150 may be employed for driving the door 30 in a closing direction when the door controller (not shown) receives a remote door closing enabling signal.

It will be appreciated that the capacitance activated switch device 40 may be further used in combination with the door 30 having only a handle 170 rigidly attached to the surface thereof as best illustrated in FIG. 6. In such embodiment, the handle 170 will produce an electric field 64 through the at least one electrical antenna conductor 52 connected thereto.

It will be further appreciated that such at least one electrical antenna conductor 52 connected directly to the door 30 manufactured from a conductive metallic material, including but not limited to aluminum and steel, will generate an electrical field 64 over the conductive surface of the door 30 thus enabling use of the door 30 as a touch switch and open such door 30 at any conductive portion thereof.

It will be understood that a typical window glass portion 174 of such door 30 will be isolated from such conductive surface and will not produce the electric field 64. However, the window glass portion 174 containing at least one and preferably an array of embedded electrodes 176 coupled to the at least one electrical antenna conductor 52, as illustrated in FIG. 6, will produce such electric field 64. It will be appreciated that utility of such embodiment would be especially pertinent in applications utilizing what is well known as an "all glass" door 30. The at least one electrical antenna conductor 52 may be routed within the wire bundle 130.

Figure 7:
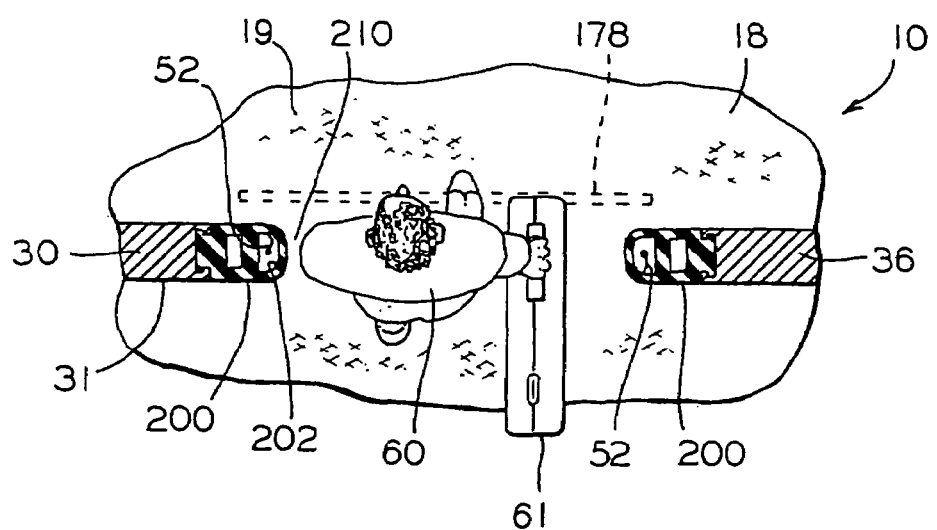
FIG. 7 is a partial top view of the doors of the transit vehicle.
Figure 8:
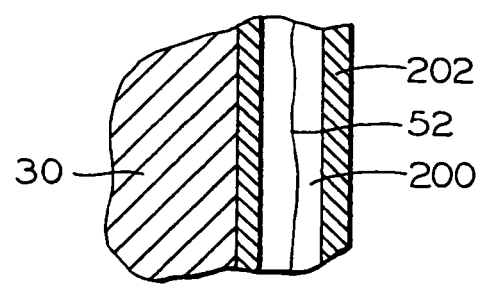
FIG. 8 is partial front elevation view of the capacitance activated switch device of the present invention in combination with the door edge.

The structure and operation of the capacitance activated switch device 40 for employment in obstruction detection is best illustrated in FIGS. 7 and 8. The leading edge 31 of the door 30 is typically adapted with a soft resilient edge 200 being an extruded elastomer such as rubber. The edge 200 is fitted with at least one longitudinal aperture 202 adjacent the outer surface of the edge 200 to enable compression thereof upon contact with the opposed edge 200 attached to the door 36 when such doors 30 and 36 are fully closed or upon contact with a passenger or an object. In applications utilizing a pressure wave switch (not shown) for obstruction detection, such at least one aperture 202 is closed at each end to provide a sealed chamber.

Placement of the at least one electrical conductor 52 within such at least one aperture 202 will create the electrical field 64 at least partially surrounding the edge 200. As the door 30 is being driven in a closed direction 204, a presence of the passenger 60 in its path, as best illustrated in FIG. 7, will generate a capacitive load 66 at a predetermined distance 210 from the edge 200 thus enabling the microcontroller 78 to generate the at least one control signal 92 which will be used by the door controller (not shown) to either discontinue movement of the door 30 in a closing direction 204 or reverse the direction of the movement to reopen the door 30. Thus, the advantage of the present invention is that such obstruction will be at least partially detected prior to a physical contact of the passenger 60 with the door 30. It will be appreciated that an object 61, such as briefcase in FIG. 7, coupled to a passenger 60 and capable of generating such capacitive load 66 will enable the microcontroller 78 to generate the at least one control signal 92.

In another embodiment of the present invention, the at least one electrode 178 may be embedded within at least a portion of the traction member 19, with such portion disposed adjacent the door 30. In such embodiment, a passenger standing on such will trigger the at least one control signal 92 preventing closing of door 30.

While the presently preferred embodiment of the instant invention has been described in detail above in accordance with the patent statutes, it should be recognized that various other modifications and adaptations of the invention may be made by those persons who are skilled in the relevant art without departing from either the spirit or the scope of the appended claims.

We claim:

1. A capacitance activated switch device for providing at least one control signal upon supply of an input voltage and an engagement of a capacitive load with an electrical field, said capacitance activated switch device comprising:

(a) a capacitance means associated with said electrical field, said capacitance means including:

(i) a generator capable of generating a sine wave of a predetermined frequency;

(ii) at least one antenna output for enabling transmission of said sine wave;

(iii) a first resistor having a predetermined resistive value and having a first lead coupled to said generator and a second lead coupled to said at least one antenna output, said first resistor enabling generation of a first voltage at said first lead and a second voltage at said second lead;

(iv) a first communication means for providing an analog signal associated with said second voltage; and (v) a second communication means for providing a predetermined plurality of first digital signals and receiving a predetermined plurality of second digital signals;

(b) a first ground coupled to said capacitance means;

(c) an operating voltage associated with said input voltage and applied to said capacitance means for enabling said generator to generate said sign wave;

(d) a microcontroller coupled to said capacitance means and having at least a third communication means being in electrical communication with said first communication means of said capacitance means for receiving said analog signal and a forth communication means being in electrical communication with said second communication means of said capacitance means for receiving said predetermined plurality of said first digital signals and providing said predetermined plurality of said second digital signals, said microcontroller providing an output signal upon receipt of said second voltage signal; and (e) an output driver means coupled to said microcontroller for receiving said output signal and for providing said at least one control signal.

2. A capacitance activated switch device according to claim 1, wherein said capacitance activated switch device includes a second resistor having a second predetermined resistive value and being electrically coupled to said capacitance means for adjusting said predetermined frequency and for defining a predetermined depth of said electrical field.

3. A capacitance activated switch device according to claim 1, wherein said capacitance activated switch device includes a means coupled to said input voltage for converting it into said operating voltage, wherein said input voltage is one of a smaller and a greater magnitude than said operating voltage.

4. A capacitance activated switch device according to claim 1, wherein said capacitance activated switch device includes a first capacitor having a predetermined capacitance value for generally defining a lower capacitance limit of said capacitance means, said first capacitor enabling generation of a first voltage reference defining a predetermined upper voltage limit associated with said capacitive load engaging said electrical field.

5. A capacitance activated switch device according to claim 1, wherein said capacitance activated switch device includes a second capacitor having a predetermined capacitance value for generally defining an upper capacitance limit of said capacitance means, said second capacitor enabling generation of a second voltage reference defining a predetermined lower voltage limit associated with said capacitive load engaging said electrical field.

6. A capacitance activated switch device according to claim 1, wherein said capacitance means includes at least one shield output.

7. A capacitance activated switch device according to claim 1, wherein said capacitance activated switch device includes a printed circuit board.

8. A capacitance activated switch device according to claim 1, wherein said at least one control signal is a voltage signal.

9. A capacitance activated switch device according to claim 8, wherein said voltage signal is equal in magnitude to said input voltage.

10. A capacitance activated switch device according to claim 1, wherein said capacitance activated switch device includes a power source disposed therein for providing said operating voltage.

11. A capacitance activated switch device according to claim 10, wherein said internal power source is an electrical battery.

12. A capacitance activated switch device according to claim 1, wherein said capacitance activated switch device includes a housing.

13. A capacitance activated switch device according to claim 1, wherein said microcontroller is capable of executing a predetermined software algorithm.

14. A capacitance activated switch device according to claim 13, wherein said predetermined software algorithm enables said microcontroller to provide said output signal when said second voltage is greater than a predetermined voltage threshold.

15. A capacitance activated switch device according to claim 13, wherein said predetermined software algorithm is capable of differentiating between a gradual movement of said capacitive load within said electrical field resulting in a gradual change of said second voltage over a first predetermined period of time and an accelerated movement of said capacitive load through said electrical field resulting in a change of said second voltage over a second predetermined period of time, said second predetermined period of time being substantially smaller than said first predetermined period of time.

16. A capacitance activated switch device according to claim 1, wherein said capacitance activated switch device includes at least one electrical antenna conductor connected to said at least one antenna output for transmitting said sine wave.

17. A capacitance activated switch device according to claim 16, wherein said capacitance activated switch device includes an activating member coupled to said at least one electrical antenna conductor and attached to a mounting structure.

18. A capacitance activated switch device according to claim 17, wherein said activating member is manufactured from one of an electrically conductive, an electrically nonconductive material and a combination thereof.

19. A capacitance activated switch device according to claim 18, wherein said capacitance activated switch device includes an electrically nonconductive member disposed intermediate said activating member and said mounting structure, wherein said activating member and said mounting structure are electrically conductive.

20. In combination with a transit vehicle having a wall member with a wall aperture and a floor portion disposed adjacent said wall aperture, said wall aperture having at least one door disposed therein, said at least one door driven by a door drive in combination with a door controller in one of a closing and an opening direction to at least partially cover and uncover said wall aperture, said at least one door supported by a door support means being one of integral and connected to said door drive, a capacitance activated switch device for at least enabling said door controller and said door drive to drive said at least one door in one of said opening and said closing direction, said capacitance activated switch device comprising:

a) an activating member disposed within said transit vehicle;

b) at least one electrical antenna conductor coupled to said activating member; and c) a control means including a generator capable of generating a sine wave of a predetermined frequency, at least one antenna output connected to said at least one electrical antenna conductor for transmitting said sine wave, a first resistor having a first predetermined resistive value having a first lead coupled to said generator and a second lead coupled to said at least one antenna output, said first resistor enabling generation of a first voltage at said first lead and a second voltage at said second lead, said second voltage is equal to said first voltage in a steady state condition, said control means coupled to an input voltage means and having a means disposed therein for providing at least one control signal to said door controller, said at least one control signal being associated with a change of said second voltage, whereby a supply of said input voltage enables said control means to generate and transmit said sign wave to said at least one electrical antenna conductor via said at least one antenna output, whereby said sign wave is carried by said at least one electrical antenna conductor to said activating member forming an electrical field about at least a portion of said activating member, said electrical field having a predetermined depth and whereby a grounded object at least partially engaging said electrical field generates a capacitive load and causes said change of said second voltage, said change being received by said control means and manipulated thereby to provide said at least one control signal to said door controller enabling said door drive to move said at least one door.

21. A capacitance activated switch device according to claim 20, wherein said activating member is disposed intermediate a first housing and a second housing rigidly attached to said at least one door.

22. A capacitance activated switch device according to claim 21, wherein said activating member is tubular and has a first end disposed within a cavity of said first housing and a second end disposed within a cavity of said second housing.

23. A capacitance activated switch device according to claim 22, wherein said first housing and said second housing are manufactured from one of an electrically conductive material, said an electrically non conductive material and a combination thereof.

24. A capacitance activated switch device according to claim 23, wherein said activating member is manufactured from one of said electrically conductive material and said electrically non conductive material.

25. A capacitance activated switch device according to claim 24, wherein said at least one electrical antenna conductor is rigidly and electrically connected to said activating member for generating said electrical field at least partially surrounding said activating member.

26. A capacitance activated switch device according to claim 24, wherein said at least one electrical antenna conductor has a rigid portion longitudinally disposed within said activating member for generating said electrical field at least partially surrounding said activating member.

27. A capacitance activated switch device according to claim 20, wherein said control means is disposed adjacent said activating member and has a predetermined plurality of electrical conductors associated with said input voltage and said at least one control signal, said predetermined plurality of said electrical conductors at least partially disposed within said at least one door.

28. A capacitance activated switch device according to claim 20, wherein said control means is disposed externally of said activating member within a structure of said transit vehicle and has said at least one electrical antenna conductor being routed through said transit vehicle structure and said at least one door for connection to said activating member.

29. A capacitance activated switch device according to claim 28, wherein said at least one electrical antenna conductor is shielded and has a shield conductor coupled to a shield output of said control means.

30. A capacitance activated switch device according to claim 20, wherein said mounting structure is manufactured from one of said electrically conductive material, said electrically non conductive material and said combination thereof.

31. A capacitance activated switch device according to claim 20, wherein said activating member is attached to a mounting structure being one of said at least one door, a partition separating a seating area from said floor portion, said structure of said transit vehicle and any combination thereof.

32. A capacitance activated switch device according to claim 31, wherein said capacitance activated switch device includes an electrically non conductive member disposed intermediate one of said first housing and said second housing and said mounting structure, wherein said first housing, said second housing and said mounting structure are electrically conductive.

33. A capacitance activated switch device according to claim 20, wherein said activating member is rigidly attached to said at least one door.

34. A capacitance activated switch device according to claim 20, wherein said activating member includes a first conductive member of a predetermined configuration, an opposed second conductive member and an insulator member disposed intermediate said first conductive member and said second conductive member.

35. A capacitance activated switch device according to claim 34, wherein said first conductive member is coupled to said at least one electrical antenna conductor and said second conductive member is coupled to said shield conductor.

36. A capacitance activated switch device according to claim 34, wherein said capacitance activated switch device includes a non conductive protective member for protecting said capacitance activated switch device from environmental factors being one of moisture, dust and dirt.

37. A capacitance activated switch device according to claim 36, wherein said capacitance activated switch device includes an indicia disposed within one of said outer protective member and said first conductive member for providing a predetermined instruction to passengers.

38. A capacitance activated switch device according to claim 34, wherein said first conductive member, said second conductive member and said insulator member are manufactured from a dual side printed circuit board material, wherein said first conductive member and said second conductive members are copper foil of a predetermined weight and said insulator member is an epoxy-glass FR-4 board having a predetermined thickness.

39. A capacitance activated switch device according to claim 34, wherein said capacitance activated switch device includes an adhesive means applied to said second conductive member.

40. A capacitance activated switch device according to claim 34, wherein said capacitance activated switch device includes a housing attached to said activating means.

41. A capacitance activated switch device according to claim 40, wherein said controls means is disposed within said housing.

42. A capacitance activated switch device according to claim 20, wherein said at least one door includes at least a portion thereof being electrically conductive, said at least conductive portion coupled to said at least one electrical antenna conductor forming said electrical field adjacent said at least conductive portion.

43. A capacitance activated switch device according to claim 20, wherein said at least one door includes a window glass portion at least partially disposed therein.

44. A capacitance activated switch device according to claim 43, wherein said window glass portion includes at least one activating member imbedded therein and coupled to said at least one electrical antenna conductor.

45. A capacitance activated switch device according to claim 20, wherein said at least one door includes a resilient door edge attached to a leading edge of said at least one door, said resilient door edge having a longitudinal cavity, said cavity having at least one electrical antenna conductor disposed therein, said at least one electrical antenna conductor forming an electrical field at least partially surrounding said resilient door edge and enabling said door controller to at least discontinue motion of said at least one door in said closing direction upon a passenger at least partially engaging said electrical field with a body portion thereof.

46. A capacitance activated switch device according to claim 20, wherein a floor portion includes at least one activating member imbedded therein and coupled to said at least one electrical antenna conductor.

47. A method of generating at least one control signal enabling movement of at least one door in a transit vehicle, said method comprising steps of:
  a) providing a capacitance activated switch device having an activating member, at least one electrical antenna conductor coupled to said activating member, a control means at least including a generator capable of generating a sine wave of a predetermined frequency, at least one antenna output connected to said at least one electrical antenna conductor for transmitting said sine wave, a first resistor having a first predetermined resistive value and having a first lead coupled to said generator and a second lead coupled to said at least one antenna output, said first resistor enabling generation of a first voltage at said first lead and a second voltage at said second lead, said second voltage is equal to said first voltage in a steady state condition, said control means coupled to an input voltage means and having a means for providing at least one control signal to said door controller, said at least one control signal being associated with a change of said second voltage;
  b) supplying an input voltage to said control means;
  c) generating a sign wave;
  d) utilizing said at least one antenna output and said at least one electrical antenna conductor to transmit said sign wave to said activating member;
  e) forming an electrical field of a predetermined depth around at least a portion of said activating member;
  f) monitoring said second voltage;
  g) utilizing said controller to identify a change in said second voltage caused by a grounded object at least partially engaging said electrical field and generating a capacitive load;
  h) comparing said change in said second voltage against a predetermined threshold; and
  i) generating said at least one control signal when said change in said second voltage exceeds said predetermined threshold.

48. A method of generating at least one control signal according to claim 47, wherein said method includes an additional step of adjusting said predetermined depth of said electrical field.

49. A method of generating at least one control signal according to claim 47, wherein said method includes an additional step of employing a pair of voltage references defining predetermined lower and upper voltage ranges.

50. A method of generating at least one control signal according to claim 49, wherein said method includes an additional step of measuring an actual value of said capacitive load at least partially engaging said electrical field.

51. A method of generating at least one control signal according to claim 49, wherein said method includes an additional step of identifying a broken electrical connection.

52. A method of generating at least one control signal according to claim 49, wherein said method includes an additional step of compensating for variations of one of an environmental temperature, an input voltage, and a combination thereof.

53. A method of generating at least one control signal according to claim 49, wherein said method includes an additional step of differentiating between a gradual movement of said capacitive load within said electrical field resulting in a gradual change of said second voltage over a first predetermined period of time and an accelerated movement of said capacitive load through said electrical field resulting in a change of said second voltage over a second predetermined period of time, said second predetermined period of time being substantially smaller than said first predetermined period of time.

* * * * *